(12) United States Patent
Lee et al.

(10) Patent No.: US 8,178,969 B2
(45) Date of Patent: May 15, 2012

(54) FLIP CHIP PACKAGE

(75) Inventors: Jong-Joo Lee, Suwon-si (KR); Tae-Joo Hwang, Anyang-si (KR); Cha-Jea Jo, Bucheon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 184 days.

(21) Appl. No.: 12/401,699

(22) Filed: Mar. 11, 2009

(65) Prior Publication Data
US 2009/0230549 A1    Sep. 17, 2009

(30) Foreign Application Priority Data
Mar. 14, 2008    (KR) .................. 10-2008-0023608

(51) Int. Cl.
*H01L 23/485*    (2006.01)
(52) U.S. Cl. .. 257/737; 257/738; 257/778; 257/E23.021
(58) Field of Classification Search .............. 257/737, 257/738, 778, E23.021
See application file for complete search history.

(56) References Cited

U.S. PATENT DOCUMENTS

| | | | | |
|---|---|---|---|---|
| 7,439,611 B2* | 10/2008 | Imamura et al. | ............... | 257/669 |
| 7,449,785 B2* | 11/2008 | Jeng et al. | ............... | 257/779 |
| 7,696,006 B1* | 4/2010 | Hoang et al. | ............... | 438/107 |
| 2005/0082685 A1* | 4/2005 | Bojkov et al. | ............... | 257/780 |
| 2006/0267219 A1* | 11/2006 | Nakamura et al. | ............... | 257/784 |
| 2007/0252274 A1* | 11/2007 | Daubenspeck et al. | ....... | 257/737 |

FOREIGN PATENT DOCUMENTS

| | | |
|---|---|---|
| JP | 10321670 | 12/1998 |
| JP | 2005086129 | 3/2005 |
| KR | 100663372 | 12/2006 |

* cited by examiner

*Primary Examiner* — Phat X Cao
(74) *Attorney, Agent, or Firm* — Stanzione & Kim, LLP (57) ABSTRACT

A flip chip package may include a substrate, a semiconductor chip, main bump structures and auxiliary bump structures. The substrate has a circuit pattern. The semiconductor chip is arranged over the substrate. The semiconductor chip includes a body having semiconductor structures, main pads electrically connected to the semiconductor structures to mainly control the semiconductor structures, and auxiliary pads electrically connected to the semiconductor structures to provide auxiliary control of the semiconductor structures. The main bump structures are interposed between the semiconductor chip and the substrate to electrically connect the circuit pattern with the main pads. The auxiliary bump structures can be interposed between the semiconductor chip and the substrate to electrically connect the circuit pattern with the auxiliary pads.

19 Claims, 6 Drawing Sheets

FLIP CHIP PACKAGE

CROSS-REFERENCE TO RELATED APPLICATIONS

This application claims priority under 35 U.S.C. §119 to Korean Patent Application No. 2008-23608, filed on Mar. 14, 2008 in the Korean Intellectual Property Office (KIPO), the contents of which are herein incorporated by reference in their entirety.

BACKGROUND

1. Field of the Invention

Example embodiments relate to a flip chip package. More particularly, example embodiments relate to a flip chip package having conductive bumps.

2. Description of the Related Art

Generally, various semiconductor processes may be performed on a semiconductor substrate to form a plurality of semiconductor chips. In order to mount the semiconductor chips on a printed circuit board (PCB), a packaging process may be performed on the semiconductor substrate to form semiconductor packages.

One type of the above-mentioned semiconductor packages may include a flip chip package. The flip chip package may have a structure where a semiconductor chip and a package substrate may confront each other. Pads of the semiconductor chip may be electrically connected to circuit patterns of the package substrate via conductive bumps in a one-to-one relation. The pads may include a power pad for supplying a power to semiconductor structures in the semiconductor chip, and a ground pad for grounding the semiconductor structures.

However, conventional pads may be arranged only on a central portion of the semiconductor chip. That is, the semiconductor structures may be driven only by a power supplied through the central pads and grounded only by the central pads. As a result, it may be difficult to stably supply the power to the semiconductor structures and stably ground the semiconductor structures. To solve these problems, it may be required to increase the number of the central pads or form pads on a portion other than the central portion of the semiconductor chip. However, this solution may cause a new problem that a size of the flip chip package increases. As a result, conventionally there may be difficulty in performing high speed operations of the flip chip package.

SUMMARY

Example embodiments provide a flip chip package that may be capable of stably receiving a power and being stably grounded without increasing a size of the flip chip package.

Additional aspects and utilities of the present general inventive concept will be set forth in part in the description which follows and, in part, will be obvious from the description, or may be learned by practice of the general inventive concept.

According to some example embodiments, there is provided a flip chip package. The flip chip package may include a substrate, a semiconductor chip, main bump structures and auxiliary bump structures. The substrate has a circuit pattern. The semiconductor chip has a body arranged over the substrate and has semiconductor structures, main pads electrically connected to the semiconductor structures to mainly control the semiconductor structures, and auxiliary pads electrically connected to the semiconductor structures to provide auxiliary control of the semiconductor structures. Main bump structures are interposed between the semiconductor chip and the substrate to electrically connect the circuit pattern with the main pads. Auxiliary bump structures are interposed between the semiconductor chip and the substrate to electrically connect the circuit pattern with the auxiliary pads.

In an example embodiment, the main pads may be arranged on a central portion of a lower surface of the body, and the auxiliary pads may be arranged on a random portion of the lower surface of the body. Additionally, sizes of the auxiliary pads may be smaller than those of the main pads.

In an example embodiment, each of the main conductive bump structures may include a passivation layer formed on the lower surface of the body and having a first main opening configured to expose the main pads, an insulating layer formed on a lower surface of the passivation layer and having a second main opening in fluidic communication with the first main opening, and a main bump formed in the first main opening and the second main opening and electrically connected to the main pads. The passivation layer may include an inorganic layer formed on the lower surface of the body, and an organic layer formed on the inorganic layer. The main bump may include a main metal bump formed in the first main opening and the second main opening, and a main solder bump formed on the main metal bump. Additionally, each of the main bump structures may further include a main under bump metallurgy (UBM) layer interposed between the insulating layer and the main bump.

In an example embodiment, each of the auxiliary bump structures may include a passivation layer formed on the lower surface of the body and having a first auxiliary opening configured to expose the auxiliary pads, an insulating layer formed on a lower surface of the passivation layer and having a second auxiliary opening in fluidic communication with the first auxiliary opening, and an auxiliary bump formed in the first auxiliary opening and the second auxiliary opening and electrically connected to the auxiliary pads.

An area of the second auxiliary opening may be greater than that of the first auxiliary opening. The second auxiliary opening may be single, and the first auxiliary opening positioned in the single second auxiliary opening may be in plural. The first auxiliary openings may be configured to expose adjacent power lines included in the semiconductor structure. A width of the second auxiliary opening may be greater than a width of a power line included in the semiconductor structure. In contrast, an area of the second auxiliary opening may be smaller than that of the first auxiliary opening.

The passivation layer may include an inorganic layer formed on the lower surface of the body, and an organic layer formed on the inorganic layer. The auxiliary bump may include an auxiliary metal bump formed in the first auxiliary opening and the second auxiliary opening, and an auxiliary solder bump formed on the auxiliary metal bump. Additionally, each of the auxiliary bump structures may further include an auxiliary under bump metallurgy (UBM) layer interposed between the insulating layer and the auxiliary bump.

In an example embodiment, the flip chip package may further include a molding member formed on the substrate to cover the semiconductor chip, and external terminals mounted on the lower surface of the substrate and electrically connected to the circuit pattern.

According to some example embodiments, there is provided a flip chip package. The flip chip package includes a substrate, a semiconductor chip, a passivation layer, an insulating layer, main bumps, auxiliary bumps, a molding member and external terminals. The substrate has a circuit pattern. The semiconductor chip includes a body arranged over the substrate and having semiconductor structures, main pads arranged on a central portion of a lower surface of the body and electrically connected to the semiconductor structures to mainly control the semiconductor structures, and auxiliary pads arranged on a portion of the lower surface of the body other than the central portion and electrically connected to the semiconductor structures to auxiliary control the semiconductor structures. The passivation layer is formed on the lower surface of the body, and has first main openings configured to expose the main pads and first auxiliary openings configured to expose the auxiliary pads and have smaller area than the first main openings. The insulating layer is formed on a lower surface of the passivation layer, and has second main openings and second auxiliary openings in fluidic communication with the first main openings and the first auxiliary openings, respectively. The main bumps are formed in the first main opening and the second main opening, and electrically connected to the main pads. Auxiliary bumps may have different, i.e., smaller or larger size than that of the main bumps. The auxiliary bumps are formed in the first auxiliary opening and the second auxiliary opening, and electrically connected to the auxiliary pads. The molding member is formed on the substrate to cover the semiconductor chip. The external terminals are mounted on the lower surface of the substrate, and electrically connected to the circuit pattern.

According to the example embodiments, the auxiliary bumps as well as the main bumps may be provided to the semiconductor chip. Thus, the semiconductor chip may be stably received a power and grounded using the auxiliary bumps as well as the main bumps. As a result, the flip chip package may be rapidly operated without increasing a size of the flip chip package.

According to some example embodiments, there is provided a flip chip package including a circuit pattern; a semiconductor chip having a body arranged over a circuit pattern and semiconductor structures thereon, the semiconductor chip including: main connection members to electrically connect the semiconductor structures to the circuit patterns to provide main control thereto, and auxiliary connection members to electrically connect the semiconductor structures to the circuit patterns to provide auxiliary control thereto.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Various example embodiments will be described more fully hereinafter with reference to the accompanying drawings, in which some example embodiments are shown. The present general inventive concept may, however, be embodied in many different forms and should not be construed as limited to the example embodiments set forth herein. Rather, these example embodiments are provided so that this disclosure will be thorough and complete, and will fully convey the scope of the present general inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1:
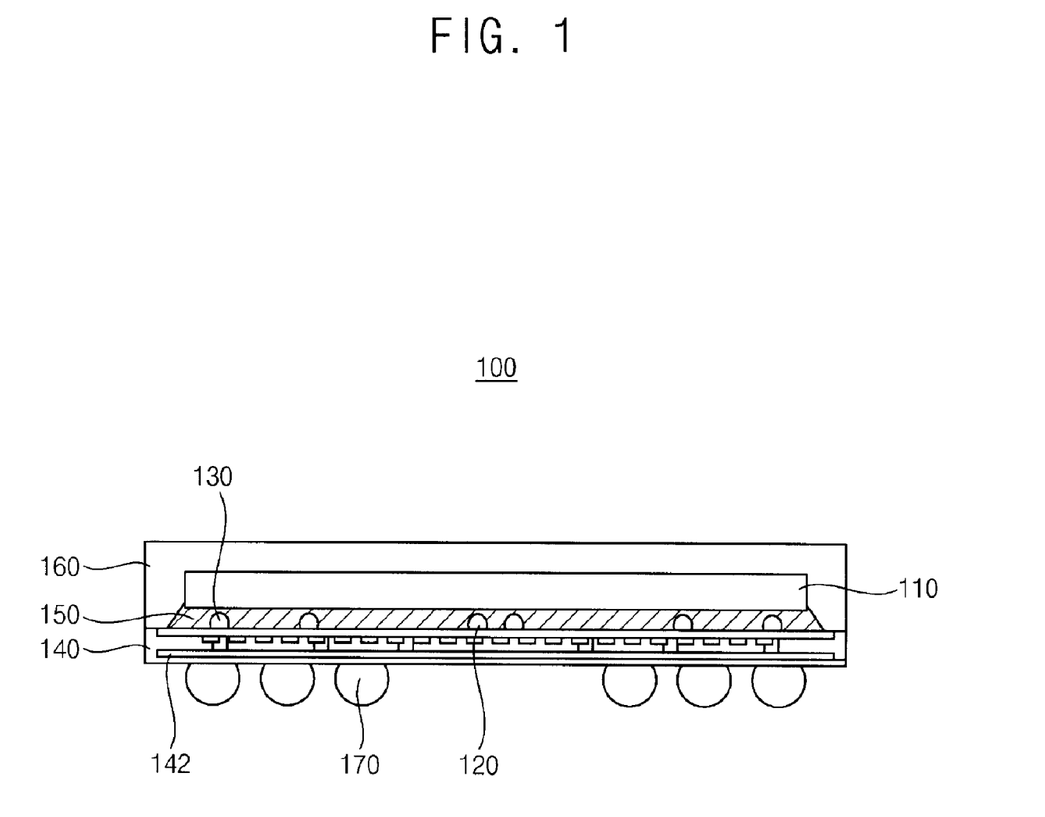
FIG. 1 is a cross-sectional view illustrating a flip chip package in accordance with an example embodiment of the present general inventive concept.
Figure 2:
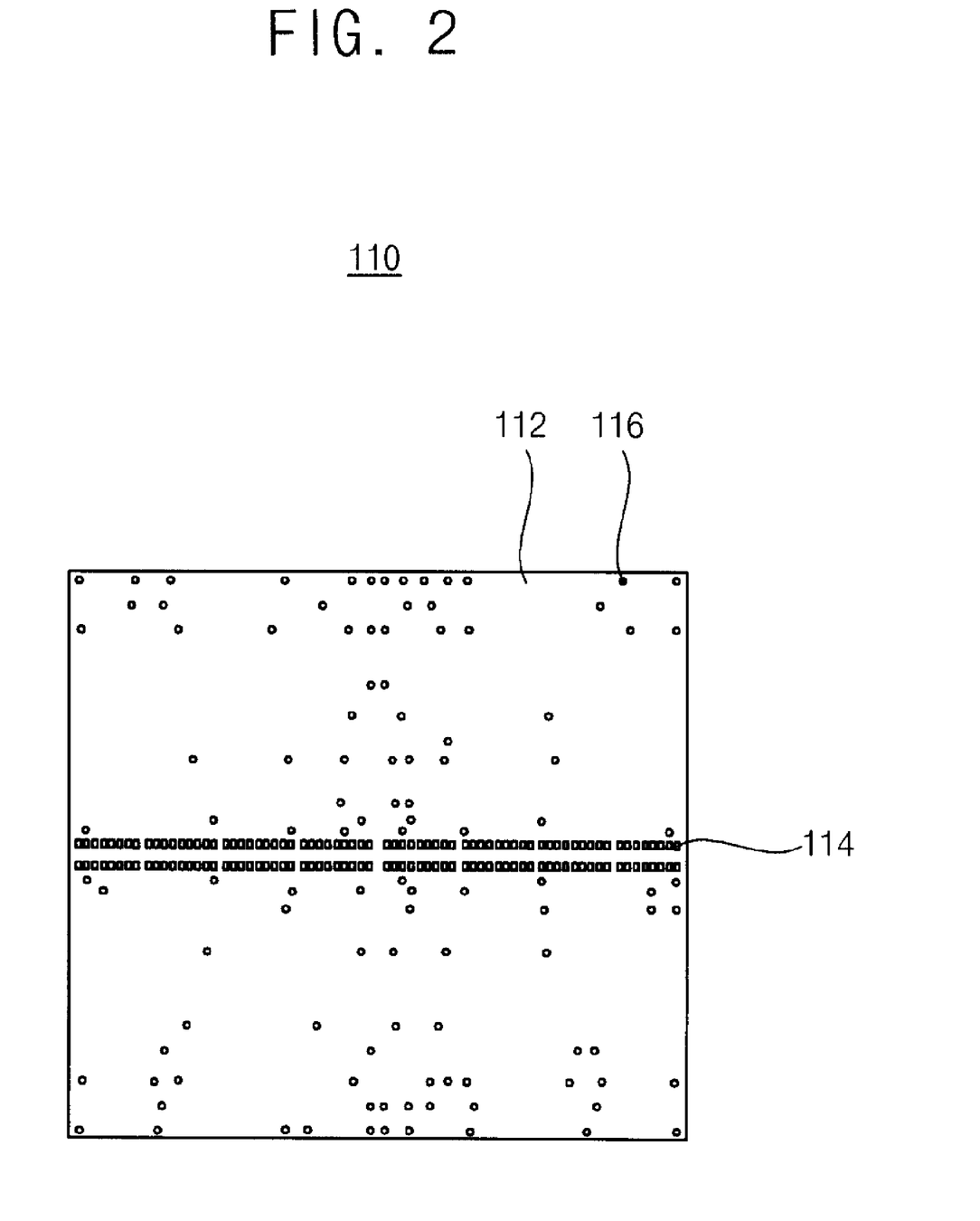
FIG. 2 is a plan view illustrating a semiconductor chip of the flip chip package in FIG. 1.
Figure 3:
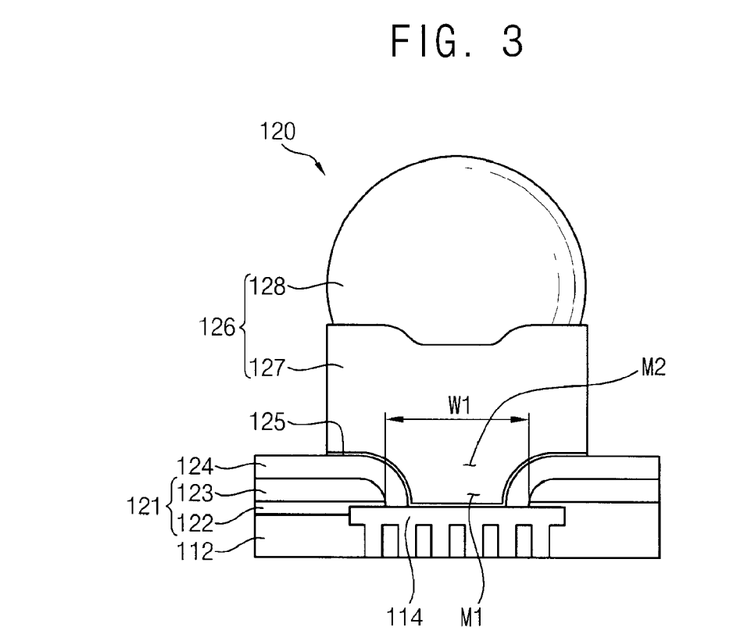
FIG. 3 is an enlarged cross-sectional view illustrating a main bump structure of the flip chip package in FIG. 1.
Figure 4:
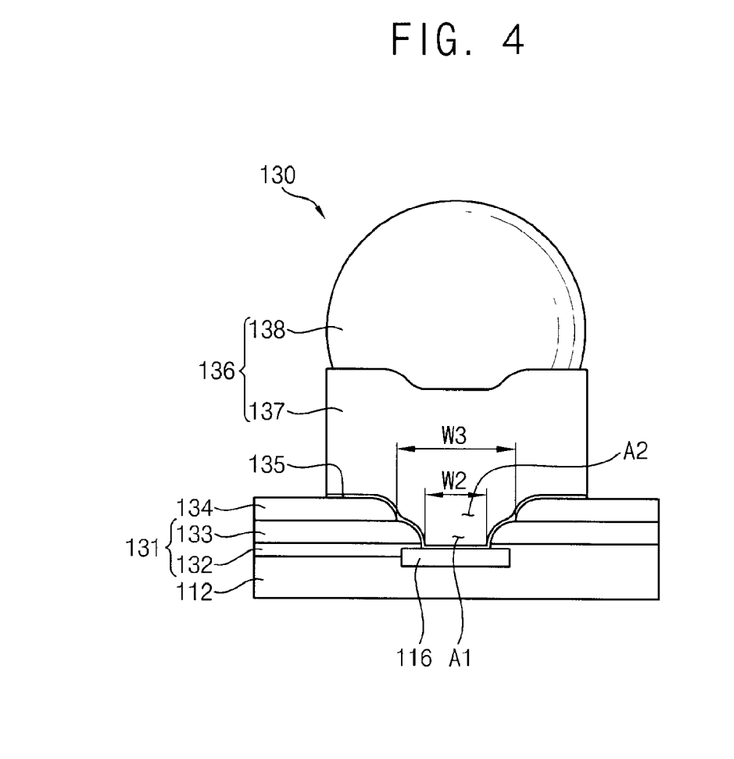
FIG. 4 is an enlarged cross-sectional view illustrating an auxiliary bump structure of the flip chip package in FIG. 1.
Figure 5:
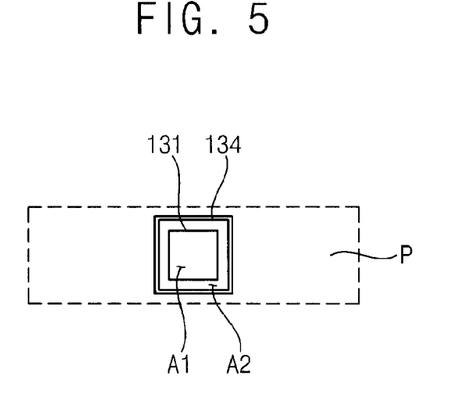
FIG. 5 is a plan view illustrating openings of the auxiliary bump structure in FIG. 4.

FIG. 1 is a cross-sectional view illustrating a flip chip package in accordance with an example embodiment of the present general inventive concept, FIG. 2 is a plan view illustrating a semiconductor chip of the flip chip package in FIG. 1, FIG. 3 is an enlarged cross-sectional view illustrating a main bump structure of the flip chip package in FIG. 1, FIG. 4 is an enlarged cross-sectional view illustrating an auxiliary bump structure of the flip chip package in FIG. 1, and FIG. 5 is a plan view illustrating openings of the auxiliary bump structure in FIG. 4.

Referring to FIG. 1, a flip chip package 100 in accordance with an example embodiment may include a substrate 140, a semiconductor chip 110, a main bump structure 120, an auxiliary bump structure 130, an underfilling layer 150, a molding member 160 and external terminals 170.

The substrate 140 may have a substantially plate shape including an insulating material. The substrate 140 may have a circuit pattern 142. In an example embodiment, the circuit pattern 142 may be exposed through an upper surface and a lower surface of the substrate 140.

Referring to FIGS. 1 and 2, the semiconductor chip 110 may be positioned over the substrate 140. The semiconductor chip 110 may include a body 112, main pads 114 and auxiliary pads 116.

The body 112 may be positioned over the substrate 140 so that a space may be formed between the body 112 and the substrate 140. Additionally, the body 112 may have a plurality of semiconductor structures (not illustrated). The body 112 may have power lines (not illustrated) to supply a power to the semiconductor structures and ground lines (not illustrated) to ground the semiconductor structures.

The main pads 114 may be arranged on a central portion of the body 112. In an example embodiment, the main pads 114 can be arranged on the central portion of a lower surface of the body 112 that may face the substrate 140. The main pads 114 may mainly control the semiconductor structures. For example, the main pads 114 may include a main signal pad, a main power pad, a main ground pad, etc. The main signal pad may transmit electrical signals such as data to the semiconductor structures, or may receive electrical signals from the semiconductor structures. The main power pad may mainly supply a power to the semiconductor structures. The main ground pad may mainly ground the semiconductor structures.

The auxiliary pads 116 may be arranged partly on the central portion of the body 112, but mainly arranged on a portion of the body 112 other than the central portion. In an example embodiment, the auxiliary pads 116 may be irregularly arranged on the lower surface of the body 112. The auxiliary pads 116 may provide auxiliary control of the semiconductor structures. For example, the auxiliary pads 116 may include an auxiliary power pad, an auxiliary ground pad, etc. The auxiliary power pad may supply an auxiliary power to the semiconductor structures. The auxiliary ground pad may provide an auxiliary ground to the semiconductor structures. That is, when a power required to perform high speed operation of the semiconductor structures may not be supplied due to a malfunction of the main power pad, and/or instability of inner-chip power interconnecting structures (not shown), an auxiliary power may be supplied from the auxiliary power pad 116 to semiconductor structures. Additionally, when the semiconductor structures may be unstably grounded due to the malfunction of the main ground pad 114 and/or instability of inner-chip ground interconnecting structures (not shown), the semiconductor structures may be stably grounded by using the auxiliary ground pad 116. Accordingly, power noises may be reduced by the auxiliary pad 116, so that the semiconductor structures may be operated at a high speed.

When the semiconductor chip 110 performs basic functions, the auxiliary pads 116 may not be necessary. Accordingly, a test process for identifying whether the semiconductor chip 110 may be performed normal or not during a low speed operation may not be necessary for the auxiliary pads 116. For example, a probe (not illustrated) of a probe device (not illustrated) may make contact with the main pad 114 to test electric characteristics of the main pad 114. To prevent mechanical effects by the probe during the test process, the main pad 114 may be required to have a strength and size without mechanical effects by contacting with the probe. In contrast, the auxiliary pads 116 may not be necessary to have strength and size corresponding to the main pads 114 because the auxiliary pads 116 may not make contact with the probe. For example, strength and size of the auxiliary pads 116 may be less and smaller, respectively, than those of the main pads 114. Accordingly, a logic circuit may not be positioned on a lower portion of main pad 114, but positioned on a lower portion of auxiliary pad 116.

Referring to FIGS. 1 and 3, the main bump structures 120 may be interposed between the semiconductor chip 110 and the substrate 140. The main bump structure 120 may electrically connect the main pads 114 to the circuit pattern 142 of the substrate 140. In an example embodiment, each of the main bump structures 120 may include a passivation layer 121, an insulating layer 124, an under bump metallurgy (UBM) layer 125 and a main bump 126.

The passivation layer 121 may be formed on the body 112 of the semiconductor chip 110, and may have a first main opening M1 configured to expose the main pad 114. The first main opening M1 may have a first width W1. In an example embodiment, the passivation layer 121 may include an inorganic layer 122 formed on the body 112 and an organic layer 123 formed on the inorganic layer 122.

The insulating layer 124 may be formed on the passivation layer 121, and may have a second main opening M2 in fluidic communication with the first main opening M1. As a result, the main pad 114 may be exposed through the first main opening M1 and the second main opening M2.

The main bump 126 may be formed on the insulating layer 124 to fill the first main opening M1 and the second main opening M2. Accordingly, the main bump 126 may electrically make contact with the main pad 114, and may be electrically connected to the circuit pattern 142 of the substrate 140. In an example embodiment, the main bump 126 may include a main metal bump 127 formed in the first main opening M1 and the second main opening M2, and a main solder bump 128 formed on the main metal bump 127. The main metal bump 127 may substantially have a cylindrical shape, and the main solder bump 128 may substantially have a spherical shape.

In addition, the UBM layer 125 may be interposed between the insulating layer 124 and the main bump 126. The UBM layer 125 may firmly fix the main bump 126 to the insulating layer 124.

Referring to FIGS. 1 and 4, the auxiliary bump structures 130 may be interposed between the semiconductor chip 110 and the substrate 140. The auxiliary bump structures 130 may electrically connect the auxiliary pads 116 to the circuit pattern 142 of substrate 140. In an example embodiment, each of the auxiliary bump structures 130 may include a passivation layer 131, an insulating layer 134, an UBM layer 135 and an auxiliary bump 136.

The passivation layer 131 may be formed on the body 112 of the semiconductor chip 110. The passivation layer 131 included in the auxiliary bump structure 130 may be substantially the same as the passivation layer 121 included in the main bump structure 120. That is, the passivation layer 131 included in the auxiliary bump structure 130 and the passivation layer 121 included in the main bump structure 120 may be formed by substantially the same process. The passivation layer 131 may have a first auxiliary opening A1 configured to expose the auxiliary pad 116. The first auxiliary opening A1 may have a second width W2. In this case, because the auxiliary pad 116 may be auxiliary used, it may not be necessary to provide the auxiliary pad 116 exposed through the first auxiliary opening A1 with an area the same or greater than that of the main pad 114 exposed through the first main opening M1. Accordingly, the second width W2 of the first auxiliary opening A1 may be smaller than the first width W1 of the first main opening M1. In an example embodiment, the passivation layer 131 may include an inorganic layer 132 formed on the body 112 and an organic layer 133 formed on the inorganic layer 132.

The insulating layer 134 may be formed on the passivation layer 131. The insulating layer 134 included in the auxiliary bump structure 130 may be substantially the same as the insulating layer 124 included in the main bump structure 120. That is, the insulating layer 134 included in the auxiliary bump structure 130 and the insulating layer 124 included in the main bump structure 120 may be formed by substantially the same process. The insulating layer 134 may have a second auxiliary opening A2 in fluidic communication with the first auxiliary opening A1. Accordingly, the auxiliary pad 116 may be exposed through the first auxiliary opening A1 and the second auxiliary opening A2. In this case, the auxiliary pad 116 may correspond to a power line P in the semiconductor chip 110. That is, the auxiliary pad 116 may be a part of the power line P and ground lines.

In an example embodiment, as shown in FIG. 5, when the power line P connected to the semiconductor structures has a sufficient width, the second auxiliary opening A2 may substantially have a square shape positioned in the power line P. Additionally, the first auxiliary opening A1 may have a square shape smaller than that of the second auxiliary opening A2.

Referring again to FIG. 1 and FIG. 4, the auxiliary bump 136 may be formed on the insulating layer 134 to fill up the first auxiliary opening A1 and the second auxiliary opening A2. Accordingly, the auxiliary bump 136 may electrically make contact with the auxiliary pad 116. The auxiliary bump 136 may be electrically connected to the circuit pattern 142 of the substrate 140. In an example embodiment, the auxiliary bump 136 may include an auxiliary metal bump 137 formed in the first auxiliary opening A1 and the second auxiliary opening A2, and an auxiliary solder bump 138 formed on the auxiliary metal bump 137. The auxiliary metal bump 137 may substantially have a cylindrical shape, and the auxiliary solder bump 138 may substantially have a spherical shape.

In addition, the UBM layer 135 may be interposed between the insulating layer 134 and the auxiliary bump 136. The UBM layer 135 may firmly fix the auxiliary bump 136 to the insulating layer 134.

Referring again to FIG. 1, the underfilling layer 150 may fill a space between the semiconductor chip 110 and the substrate 140. The underfilling layer 150 may protect the main bump structure 120 and the auxiliary bump structure 130 from external impacts. In an example embodiment, the underfilling layer 150 may include a glop top, an epoxy molding compound (EMC), etc.

The molding member 160 may be formed on the substrate 140 to cover the semiconductor chip 110. The molding member 160 may protect the semiconductor chip 110 from external impacts. A material of the molding member 160 may be substantially the same as that of the underfilling layer 150. The molding member 160 and the underfilling layer 150 may be formed by substantially the same process.

The external terminals 170 may be mounted on the lower surface of the substrate 140. The external terminals 170 may be electrically connected to the circuit pattern 142. The external connecting terminals 170 may include a solder ball.

According to this example embodiment, power may be stably supplied to the semiconductor chip by the additional auxiliary pad. Further, the semiconductor chip may be stably grounded. Accordingly, the flip chip package may be operated at a high speed for a long time without effects of the power noises.

Figure 6:
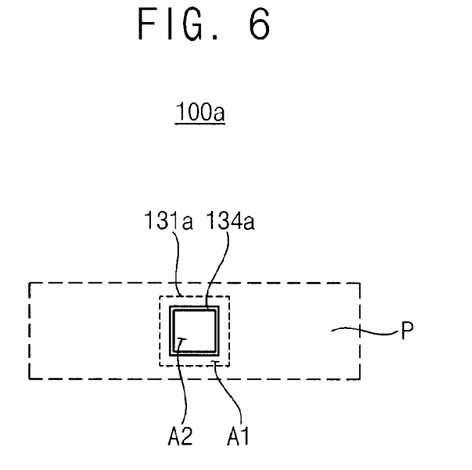
FIG. 6 is a plan view illustrating an auxiliary bump structure of a flip chip package in accordance with another example embodiment of the present general inventive concept.

FIG. 6 is a plan view illustrating an auxiliary bump structure of a flip chip package in accordance with another example embodiment of the present general inventive concept.

The flip chip package 100a of this example embodiment may include elements substantially the same as those of the flip chip package 100 except for a passivation layer and an insulating layer. Thus, the same reference numerals refer to the same elements, and any further explanation with respect to the same elements are omitted herein for brevity.

Referring to FIG. 6, when the power line P connected to the semiconductor structures have a sufficient wide width, the second auxiliary opening A2 may substantially have a square shape positioned in the power line P. Additionally, the first auxiliary opening A1 formed in a passivation layer 131a may also have a square shape. An area of the first auxiliary opening A1 may be greater than that of the second auxiliary opening A2. That is, an inner wall of the first auxiliary opening A1 covered with an insulating layer 134a may not be shown.

Figure 7:
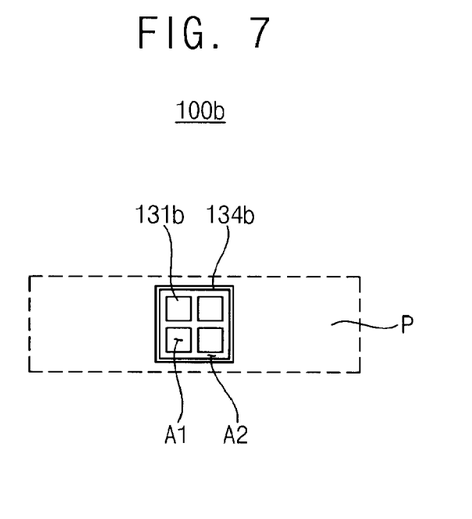
FIG. 7 is a plan view illustrating an auxiliary bump structure of a flip chip package in accordance with another example embodiment of the present general inventive concept.

FIG. 7 is a plan view illustrating an auxiliary bump structure of a flip chip package in accordance with another example embodiment of the present general inventive concept.

The flip chip package 100b of this example embodiment may include elements substantially the same as those of the flip chip package 100 except for a passivation layer and an insulating layer. Thus, the same reference numerals refer to the same elements, and any further explanation with respect to the same elements are omitted herein for brevity.

Referring to FIG. 7, when the power line P connected to the semiconductor structures have a sufficient wide width, the second auxiliary opening A2 on an insulating layer 134b may substantially have a square shape positioned in the power line P. Additionally, the first auxiliary opening A1 formed in a passivation layer 131b may have four square shapes within the second auxiliary opening A2. The auxiliary pad 116 may be exposed through the four first auxiliary openings A1.

Figure 8:
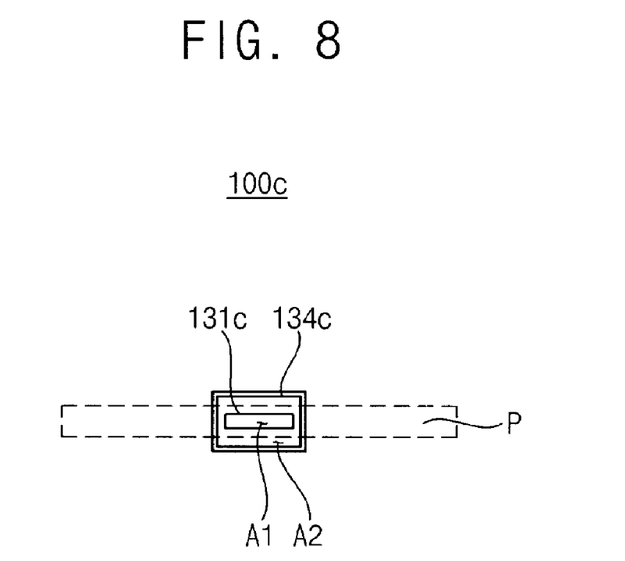
FIG. 8 is a plan view illustrating an auxiliary bump structure of a flip chip package in accordance with yet another example embodiment of the present general inventive concept.

FIG. 8 is a plan view illustrating an auxiliary bump structure of a flip chip package in accordance with yet another example embodiment of the present general inventive concept.

The flip chip package 100c of this example embodiment may include elements substantially the same as those of the flip chip package 100 except for a passivation layer and an insulating layer. Thus, the same reference numerals refer to the same elements, and any further explanation with respect to the same elements are omitted herein for brevity.

Referring to FIG. 8, when the power line P connected to the semiconductor structures have a narrow width, the second auxiliary opening A2 on an insulating layer 134c may substantially have a rectangular shape having a width that may be configured to be greater than the width of the power line P. Additionally, the first auxiliary opening A1 formed in a passivation layer 131c may have a single rectangular shape in the second auxiliary opening A2.

Figure 9:
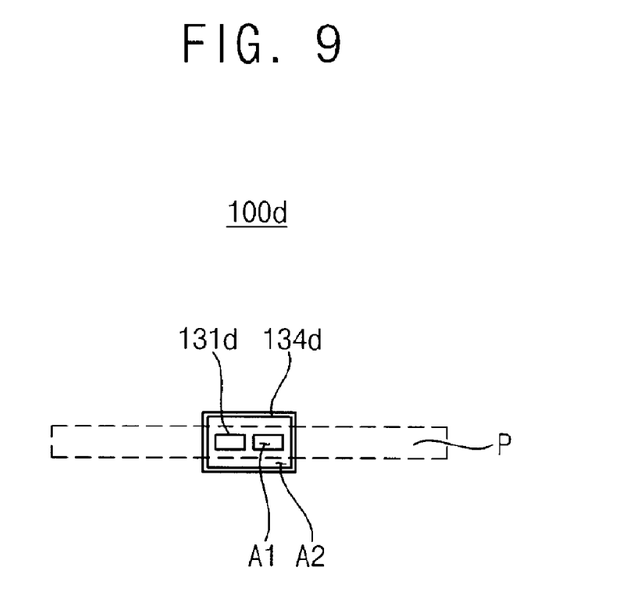
FIG. 9 is a plan view illustrating an auxiliary bump structure of a flip chip package in accordance with still another example embodiment of the present general inventive concept.

FIG. 9 is a plan view illustrating an auxiliary bump structure of a flip chip package in accordance with yet another example embodiment of the present general inventive concept.

The flip chip package 100d of this example embodiment may include elements substantially the same as those of the flip chip package 100 except for a passivation layer and an insulating layer. Thus, the same reference numerals refer to the same elements, and any further explanation with respect to the same elements are omitted herein for brevity.

Referring to FIG. 9, when the power line P connected to the semiconductor structures have a narrow width, the second auxiliary opening A2 on an insulating layer 134d may substantially have a rectangular shape having a width that may be configured to be greater than the width of the power line P. Additionally, the first auxiliary opening A1 formed in a passivation layer 131d may have two rectangular shapes in the second auxiliary opening A2.

Figure 10:
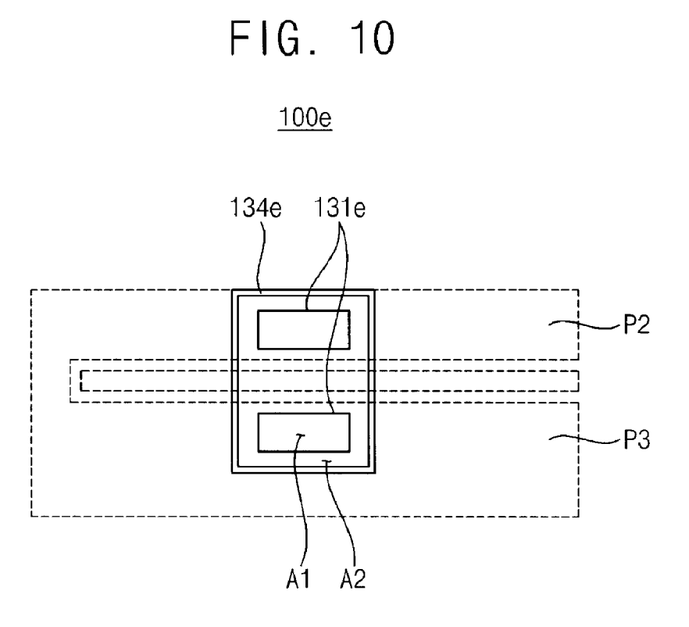
FIG. 10 is a plan view illustrating an auxiliary bump structure of a flip chip package in accordance with still another example embodiment of the present general inventive concept.

FIG. 10 is a plan view illustrating an auxiliary bump structure of a flip chip package in accordance with still another example embodiment of the present general inventive concept.

The flip chip package 100e of this example embodiment may include elements substantially the same as those of the flip chip package 100 except for a passivation layer and an insulating layer. Thus, the same reference numerals refer to the same elements, and any further explanation with respect to the same elements are omitted herein for brevity.

Referring to FIG. 10, when the adjacent two power lines P2 and P3 connected to the semiconductor structures and having substantially the same potential may be arranged in parallel with each other, the first auxiliary opening A1 in the passivation layer 131e may be two in number and located in each of the power lines P2 and P3. The second auxiliary opening A2 on an insulating layer 134e may substantially have a size configured to expose the two first auxiliary openings A1.

Figure 11:
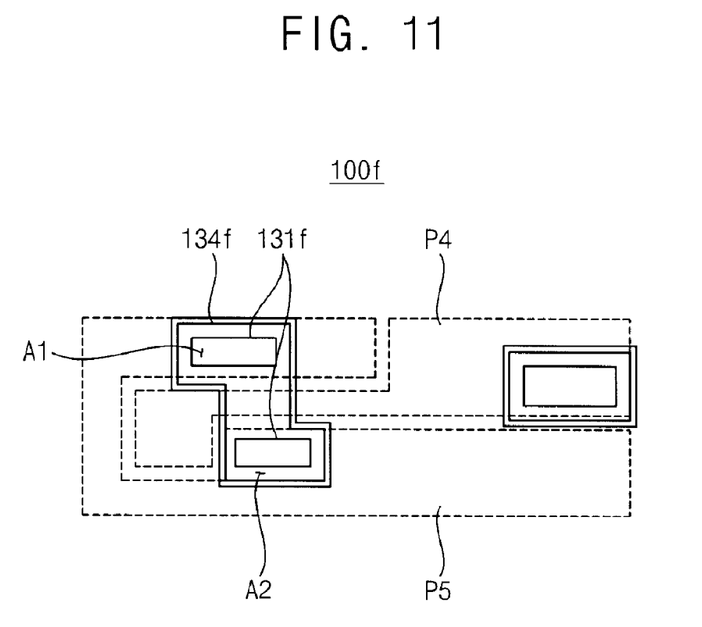
FIG. 11 is a plan view illustrating an auxiliary bump structure of a flip chip package in accordance with yet another example embodiment of the present general inventive concept.

FIG. 11 is a plan view illustrating an auxiliary bump structure of a flip chip package in accordance with yet another example embodiment of the present general inventive concept.

The flip chip package 100f of this example embodiment may include elements substantially the same as those of the flip chip package 100 except for a passivation layer and an insulating layer. Thus, the same reference numerals refer to the same elements, and any further explanation with respect to the same elements are omitted herein for brevity.

Referring to FIG. 11, when the adjacent two power lines P4 and P5 connected to the semiconductor structures have a bent shape, the first auxiliary opening A1 in the passivation layer 131f may be three in number located in each of the power lines P4 and P5. Here, the power lines P4 and P5 may have different potentials. For example, the power line P4 may correspond to a power line and the power line P5 may correspond to a ground line. The second auxiliary opening A2 on an insulating layer 134f may substantially have a bent shape configured to expose the adjacent two first auxiliary openings A1.

As mentioned above, according to some example embodiments, the power may be supplied to the semiconductor chip through the main pad as well as the auxiliary pad. Additionally, the semiconductor chip may be grounded by using the main pad as well as the auxiliary pad. Accordingly, the power may be stably supplied to the semiconductor chip and the semiconductor chip may be stably grounded. As a result, the flip chip package may be stably operated at a high speed.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A flip chip package comprising:
a substrate having a circuit pattern;
a semiconductor chip including:
a body arranged over the substrate and having semiconductor structures,
main pads electrically connected to the semiconductor structures to mainly control the semiconductor structures, and
auxiliary pads electrically connected to the semiconductor structures to provide auxiliary control of the semiconductor structures, only the auxiliary pads supplying an auxiliary power to the semiconductor structures and providing an auxiliary ground to the semiconductor structures; and
a logic circuit positioned on lower portions of the auxiliary pads;
main bump structures interposed between the semiconductor chip and the substrate to electrically connect the circuit pattern with the main pads; and
auxiliary bump structures interposed between the semiconductor chip and the substrate to electrically connect the circuit pattern with the auxiliary pads.

2. The flip chip package of claim 1, wherein the main pads are arranged on a central portion of a lower surface of the body and the auxiliary pads are arranged on portions of the lower surface of the body other than the central portion.

3. The flip chip package of claim 1, wherein each of the main bump structures comprises:
a passivation layer formed on the lower surface of the body and having a first main opening configured to expose the main pads;
an insulating layer formed on a lower surface of the passivation layer and having a second main opening in fluid communication with the first main opening; and
a main bump formed in the first main opening and the second main opening and electrically connected to the main pads.

4. The flip chip package of claim 3, wherein the passivation layer comprises:
an inorganic layer formed on the lower surface of the body; and
an organic layer formed on the inorganic layer.

5. The flip chip package of claim 3, wherein the main bump comprises:
a main metal bump formed in the first main opening and the second main opening; and
a main solder bump formed on the main metal bump.

6. The flip chip package of claim 3, wherein each of the main bump structures further comprises:
a main under bump metallurgy (UBM) layer interposed between the insulating layer and the main bump.

7. The flip chip package of claim 1, wherein each of the auxiliary bump structures comprises:
a passivation layer formed on the lower surface of the body and having a first auxiliary opening configured to expose the auxiliary pads;
an insulating layer formed on a lower surface of the passivation layer and having a second auxiliary opening in fluidic communication with the first auxiliary opening; and
an auxiliary bump formed in the first auxiliary opening and the second auxiliary opening and electrically connected to the auxiliary pads.

8. The flip chip package of claim 7, wherein the second auxiliary opening has an area greater than that of the first auxiliary opening.

9. The flip chip package of claim 8, wherein the second auxiliary opening is single, and the first auxiliary opening positioned in the single second auxiliary opening is in plural.

10. The flip chip package of claim 9, wherein the first auxiliary openings are configured to expose adjacent power lines included in the semiconductor structure within the second auxiliary opening.

11. The flip chip package of claim 8, wherein the second auxiliary opening has a width greater than that of a power line included in the semiconductor structure.

12. The flip chip package of claim 7, wherein the second auxiliary opening has an area smaller than that of the first auxiliary opening.

13. The flip chip package of claim 7, wherein the passivation layer comprises:
an inorganic layer formed on the lower surface of the body; and
an organic layer formed on the inorganic layer.

14. The flip chip package of claim 7, wherein the auxiliary bump comprises:
an auxiliary metal bump formed in the first auxiliary opening and the second auxiliary opening; and
an auxiliary solder bump formed on the auxiliary metal bump.

15. The flip chip package of claim 7, wherein each of the auxiliary bump structures further comprises an auxiliary under bump metallurgy (UBM) layer interposed between the insulating layer and the auxiliary bump.

16. The flip chip package of claim 1, further comprising:
a molding member formed on the substrate to cover the semiconductor chip.

17. The flip chip package of claim 1, further comprising:
external terminals mounted on the lower surface of the substrate and electrically connected to the circuit pattern.

18. A flip chip package, comprising:
a substrate having a circuit pattern;
a semiconductor chip including:
a body arranged over the substrate and having semiconductor structures,
main pads arranged on a central portion of a lower surface of the body, and electrically connected to the semiconductor structures to mainly control the semiconductor structures, and
auxiliary pads arranged on a portion of the lower surface of the body other than the central portion and electrically connected to the semiconductor structures to provide auxiliary control of the semiconductor structures, only the auxiliary pads supplying an auxiliary power to the semiconductor structures and providing an auxiliary ground to the semiconductor structures; and
a logic circuit positioned on lower portions of the auxiliary pads;
a passivation layer formed on the lower surface of the body and having first main openings configured to expose the main pads and first auxiliary openings configured to expose the auxiliary pads and to have a smaller area than the first main openings;
an insulating layer formed on a lower surface of the passivation layer and having second main openings and second auxiliary openings in fluid communication with the first main openings and the first auxiliary openings, respectively;

main bumps formed in the first main opening and the second main opening and electrically connected to the main pads;

auxiliary bumps formed in the first auxiliary opening and the second auxiliary opening and electrically connected to the auxiliary pads, the auxiliary bumps having a different size from the main bumps;

a molding member formed on the substrate to cover the semiconductor chip; and external terminals mounted on the lower surface of the substrate and electrically connected to the circuit pattern.

19. The flip chip package of claim 18, further comprising:
an under bump metallurgy (UBM) layer interposed between the insulating layer and the main bump, and between the insulating layer and the auxiliary bump, respectively.

* * * * *